(12) United States Patent
Furuya

(10) Patent No.: US 9,174,441 B2
(45) Date of Patent: *Nov. 3, 2015

(54) LIQUID EJECTING HEAD, LIQUID EJECTING APPARATUS, PIEZOELECTRIC ELEMENT, AND METHOD FOR MANUFACTURING PIEZOELECTRIC ELEMENT

(71) Applicant: SEIKO EPSON CORPORATION, Tokyo (JP)

(72) Inventor: Noboru Furuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/185,173

(22) Filed: Feb. 20, 2014

(65) Prior Publication Data

US 2014/0253641 A1 Sep. 11, 2014

(30) Foreign Application Priority Data

Mar. 5, 2013 (JP) .................................. 2013-043531

(51) Int. Cl.
| | |
|---|---|
| *B41J 2/045* | (2006.01) |
| *B41J 2/14* | (2006.01) |
| *B41J 2/16* | (2006.01) |
| *H01L 41/047* | (2006.01) |

(52) U.S. Cl.
CPC .......... *B41J 2/14201* (2013.01); *B41J 2/14233* (2013.01); *B41J 2/161* (2013.01); *B41J 2/1607* (2013.01); *B41J 2/1625* (2013.01); *B41J 2/1643* (2013.01); *H01L 41/0477* (2013.01); *B41J 2002/14491* (2013.01)

(58) Field of Classification Search
None
See application file for complete search history.

(56) References Cited

U.S. PATENT DOCUMENTS

| | | | |
|---|---|---|---|
| 5,311,218 A * | 5/1994 | Ochiai et al. | .................... 347/71 |
| 6,739,026 B2 * | 5/2004 | Harajiri | ........................ 29/25.35 |
| 8,029,109 B2 | 10/2011 | Yazaki | |
| 8,057,018 B2 | 11/2011 | Yazaki et al. | |
| 2002/0047876 A1 | 4/2002 | Irinoda et al. | |
| 2005/0064633 A1 | 3/2005 | Mikoshiba | |
| 2007/0042613 A1 | 2/2007 | Yoda | |
| 2009/0219345 A1* | 9/2009 | Yazaki et al. | .................... 347/68 |
| 2011/0141200 A1 | 6/2011 | Osawa et al. | |
| 2012/0005871 A1* | 1/2012 | Hirai et al. | .................... 29/25.35 |

FOREIGN PATENT DOCUMENTS

| | | |
|---|---|---|
| EP | 1167039 | 1/2002 |
| GB | 2362609 | 11/2001 |
| JP | 2007-190892 | 8/2007 |

(Continued)

OTHER PUBLICATIONS

European Search report for Application No. 14155902.1 dated Jun. 18, 2014.

*Primary Examiner* — Erica Lin
(74) *Attorney, Agent, or Firm* — Workman Nydegger

(57) ABSTRACT

A flow channel substrate has pressure chambers, and the pressure chambers communicate with nozzle openings configured to eject liquid. Each of piezoelectric elements on the flow channel substrate has a piezoelectric layer, a pair of electrodes, and a wiring layer coupled to the electrodes. The wiring layer has a first layer on the flow channel substrate side and a second layer on the first layer. The first layer contains palladium and is formed by pretreatment, whereas the second layer contains nickel and is formed by electroless plating.

11 Claims, 11 Drawing Sheets

(56) References Cited

FOREIGN PATENT DOCUMENTS

| | | |
|---|---|---|
| JP | 2008-114370 | 5/2008 |
| JP | 2009-172878 | 8/2009 |
| JP | 2009-196329 | 9/2009 |

* cited by examiner

LIQUID EJECTING HEAD, LIQUID EJECTING APPARATUS, PIEZOELECTRIC ELEMENT, AND METHOD FOR MANUFACTURING PIEZOELECTRIC ELEMENT

BACKGROUND

1. Technical Field

The present invention relates to a liquid ejecting head that ejects liquid through nozzle openings, a liquid ejecting apparatus that has a liquid ejecting head, a piezoelectric element for liquid ejecting heads or similar devices, and a method for manufacturing a piezoelectric element.

2. Related Art

A known liquid ejecting head ejects droplets of liquid through nozzle openings by deforming piezoelectric elements to change the pressure in the liquid in pressure chambers that communicate with the nozzle openings. A representative example of a liquid ejecting head is an ink jet recording head, which ejects droplets of ink.

A typical ink jet recording head has a flow channel substrate, and also has pressure chambers and piezoelectric elements on either side of the flow channel substrate. The pressure chambers communicate with nozzle openings. The piezoelectric elements operate to deform diaphragms and change the pressure in the ink filled in the pressure chambers. As a result, droplets of the ink are ejected through the nozzle openings.

In a typical structure, each piezoelectric element has a first electrode, a piezoelectric layer, and a second electrode all disposed on a diaphragm, and the first electrode and the second electrode are coupled to a wiring layer for coupling with wiring that leads to a driving IC and other components (e.g., see JP-A-2008-114370, JP-A-2009-172878, and JP-A-2009-196329).

When the wiring layer has an adhesion layer made of nickel-chromium or a similar material, patterning the adhesion layer by wet etching causes electrochemical corrosion to occur at the boundaries between the adhesion layer and the electrodes because the wet etching process uses an acid as etchant. This sort of damage may lead to events such as detachment of the electrodes or the wiring layer.

The use of an acid to wet-etch the adhesion layer may also affect the piezoelectric properties because the acid can damage the piezoelectric element.

Furthermore, it is costly to form the wiring layer by gas-phase processes such as sputtering.

Such problems are not unique to ink jet recording heads. Similar problems may also be encountered with liquid ejecting heads used with liquids other than ink. Like piezoelectric elements for liquid ejecting heads, piezoelectric elements for other devices also have similar problems.

SUMMARY

An advantage of some aspects of the invention is that they provide a liquid ejecting head, a liquid ejecting apparatus, and a piezoelectric element that all have the following advantages: a reduced risk of detachment of electrodes and a wiring layer; reduced damage to a piezoelectric layer; and lowered cost. An advantage of some other aspects of the invention is that they provide a method for manufacturing such a piezoelectric element.

An aspect of the invention provides a liquid ejecting head that has a flow channel substrate and a piezoelectric element. The flow channel substrate has a pressure chamber that communicates with a nozzle opening configured to eject liquid. The piezoelectric element is provided to the flow channel substrate and has a piezoelectric layer, a pair of electrodes, and a wiring layer coupled to the electrodes. The wiring layer has a first layer on the flow channel substrate side and a second layer on the first layer. The first layer contains palladium and is formed by pretreatment, whereas the second layer contains nickel and is formed by electroless plating.

The structure of the wiring layer in this aspect of the invention, i.e., a first layer formed by pretreatment and a second layer formed by electroless plating, reduces the cost. Furthermore, electroless plating allows the second layer to be formed selectively on the first layer with no patterning required and therefore reduces the risk of damage to the piezoelectric layer that could be caused by the use of an etchant for patterning. The risk of electrochemical corrosion that could occur between the electrodes and the wiring layer with the use of an etchant is also reduced; the use of electroless plating also makes the wiring layer less likely to detach.

Preferably, the wiring layer further has a third layer on the second layer and a fourth layer on the third layer. The third layer contains palladium and is formed by electroless plating, whereas the fourth layer contains gold and is also formed by electroless plating. The second layer reduces the electrical resistance, and the fourth layer provides strength so that external wiring can be firmly attached to the wiring layer. Furthermore, the use of the third and fourth layers allows the user to improve the packing density by reducing the pitch of the wiring layer. The third layer also helps to limit the interdiffusion of nickel and gold that leads to the fourth layer disappearing.

The pair of electrodes may be a first electrode on the flow channel substrate side and a second electrode on the side of the flow channel substrate opposite the piezoelectric layer.

In such a case it is preferred that the first electrode includes separate electrodes for active sections (i.e., practical actuating elements) and the second electrode serves as a common electrode for the active sections. The separate electrodes are electrically isolated from each other, whereas the common electrode is electrically continuous. This structure allows the first electrode to be covered with the piezoelectric layer and therefore eliminates the need for a protection coating that would be otherwise required to reduce the leakage current between the first and second electrodes. This arrangement therefore provides excellent displacement properties to the piezoelectric element in the liquid ejecting head as a result of the exclusion of a protection coating that would interfere with the movement of the piezoelectric element.

It is also preferred that the pretreatment for forming the first layer is dip coating. Dip coating allows batch processing and improves the efficiency of the production process.

Another aspect of the invention provides a liquid ejecting apparatus that has a liquid ejecting head according to the preceding aspect.

A liquid ejecting apparatus according to this aspect of the invention is advantageous because of a reduced risk of detachment of electrodes and wiring, reduced damage to a piezoelectric layer, and lowered cost.

Another aspect of the invention provides a piezoelectric element that has a piezoelectric layer, a pair of electrodes, and a wiring layer coupled to the electrodes. The wiring layer has a first layer on the flow channel substrate side and a second layer on the first layer. The first layer contains palladium and is formed by pretreatment, whereas the second layer contains nickel and is formed by electroless plating.

The structure of the wiring layer in this aspect of the invention, i.e., a first layer formed by pretreatment and a second layer formed by electroless plating, reduces the cost. Furthermore, electroless plating allows the second layer to be formed selectively on the first layer with no patterning required and therefore reduces the risk of damage to the piezoelectric layer that could be caused by the use of an etchant for patterning. The risk of electrochemical corrosion that could occur between the electrodes and the wiring layer with the use of an etchant is also reduced; the use of electroless plating also makes the wiring layer less likely to detach.

Another aspect of the invention provides a method for manufacturing a piezoelectric element that has a piezoelectric layer, a pair of electrodes, and a wiring layer coupled to the electrodes. A method according to this aspect of the invention includes forming a mask on the electrodes with the electrodes exposed, and the mask is perforated at least in the region where the wiring layer is to be formed. Then a first layer that contains palladium is formed by pretreatment, the mask is removed, and a second layer that contains nickel is formed on the first layer by electroless plating.

The structure of the wiring layer in this aspect of the invention, i.e., a first layer formed by pretreatment and a second layer formed by electroless plating, reduces the cost. Furthermore, electroless plating allows the second layer to be formed selectively on the first layer with no patterning required and therefore eliminates the risk of damage to the piezoelectric layer that could be caused by the use of an etchant for patterning. The electrochemical corrosion that could occur between the electrodes and the wiring layer with the use of an etchant is also prevented; the use of electroless plating also makes the wiring layer less likely to detach.

Preferably, this method further includes forming a third layer on the second layer by electroless plating and forming a fourth layer on the third layer by electroless plating. The third layer contains palladium, whereas the fourth layer contains gold. This allows the third and fourth layers to be formed selectively on the second layer with no patterning required. The second layer reduces the electrical resistance, and the fourth layer provides strength so that external wiring can be easily attached to the wiring layer. Furthermore, the use of the third and fourth layers allows the user to improve the packing density by reducing the pitch of the wiring layer. The third layer also helps to limit the interdiffusion of nickel and gold that leads to the fourth layer disappearing.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following details some embodiments of the invention with reference to the accompanying drawings.

Embodiment 1

Figure 1:
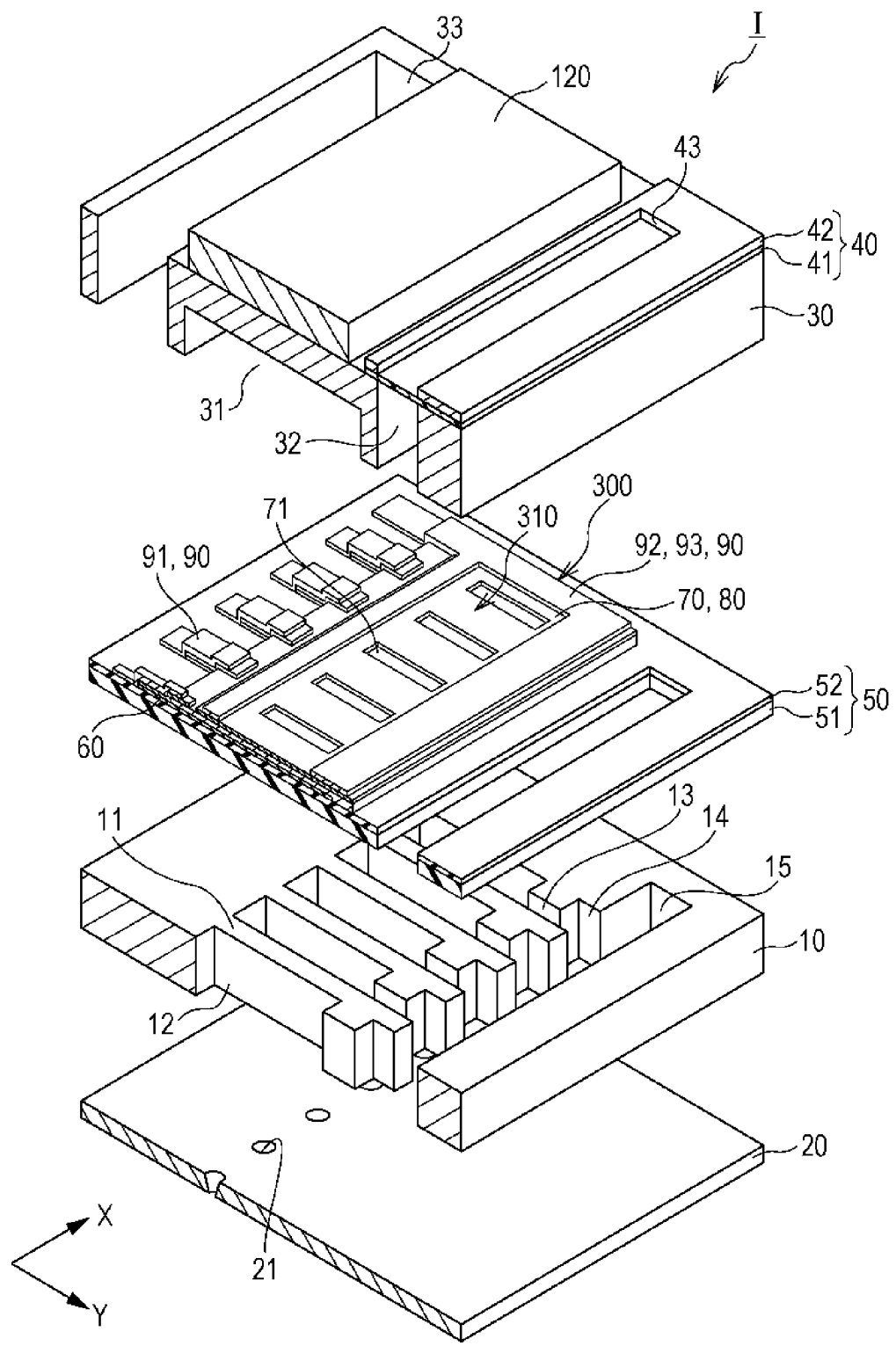
FIG. 1 is an exploded perspective view of a recording head according to Embodiment 1 of the invention.
Figure 2:
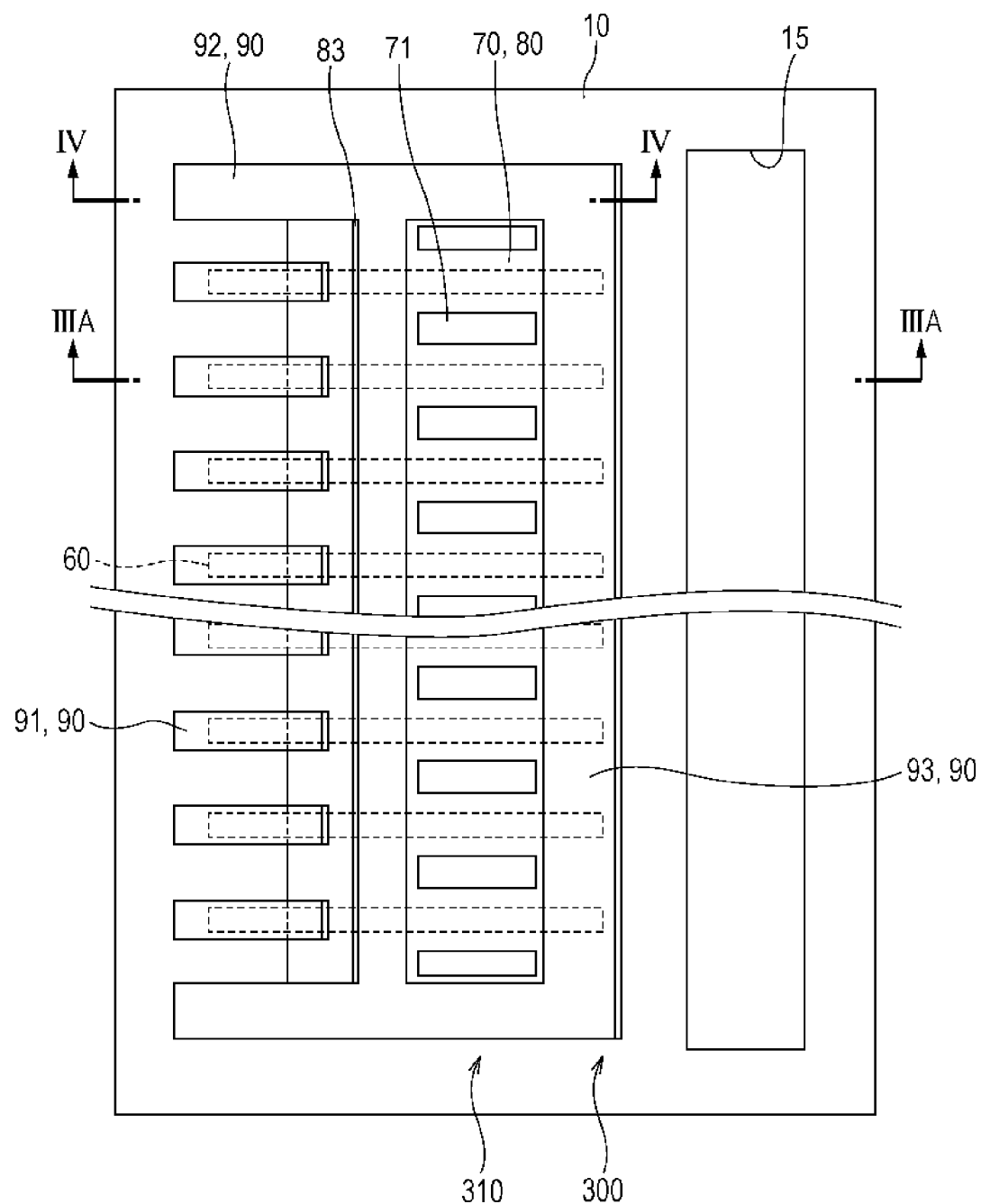
FIG. 2 is a plan view of the flow channel substrate used in the recording head according to Embodiment 1 of the invention.
Figure 3A:
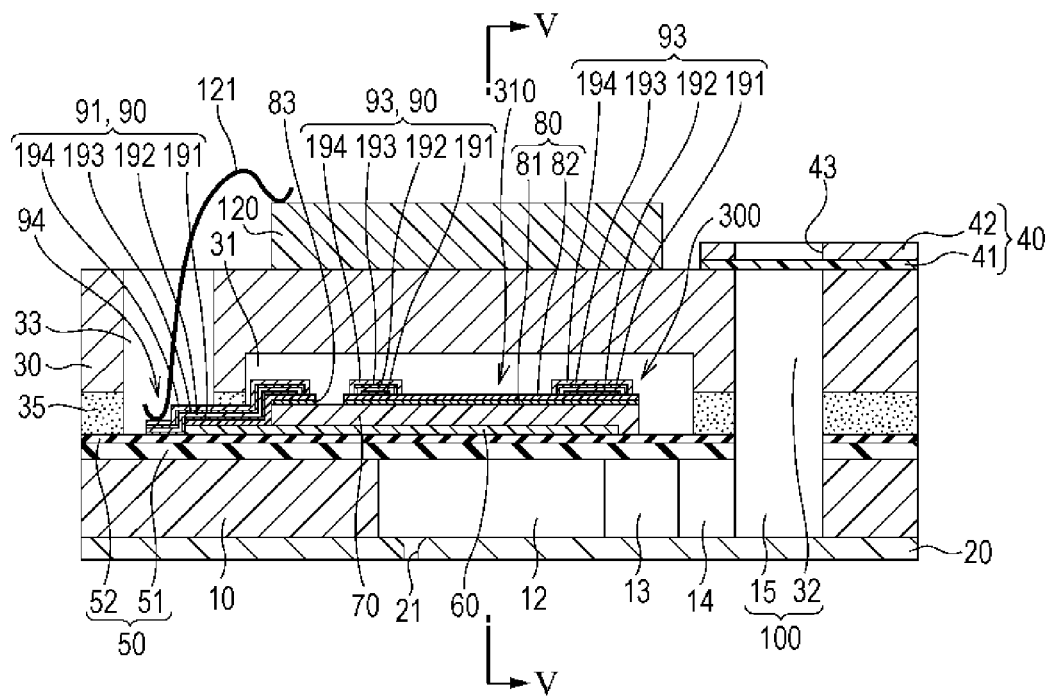
FIGS. 3A and 3B are a cross-sectional view and an enlarged cross-sectional view, respectively, of the recording head according to Embodiment 1 of the invention.
Figure 3B:
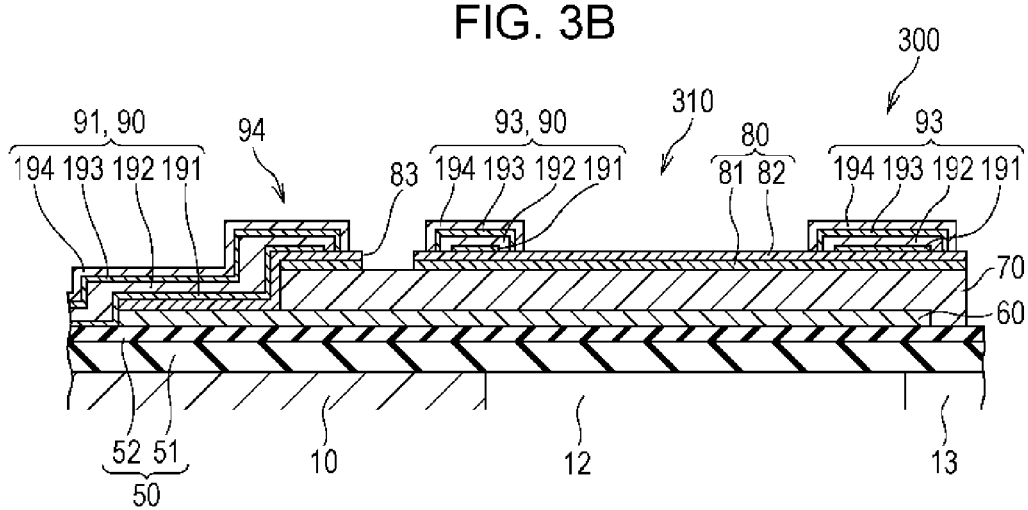
Figure 4:
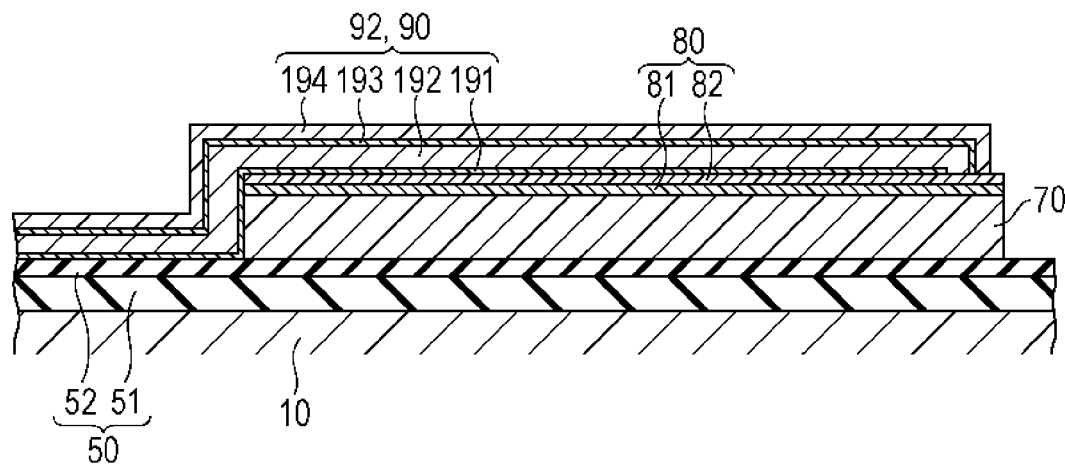
FIG. 4 is an enlarged cross-sectional view of some essential components of the recording head according to Embodiment 1 of the invention.
Figure 5:
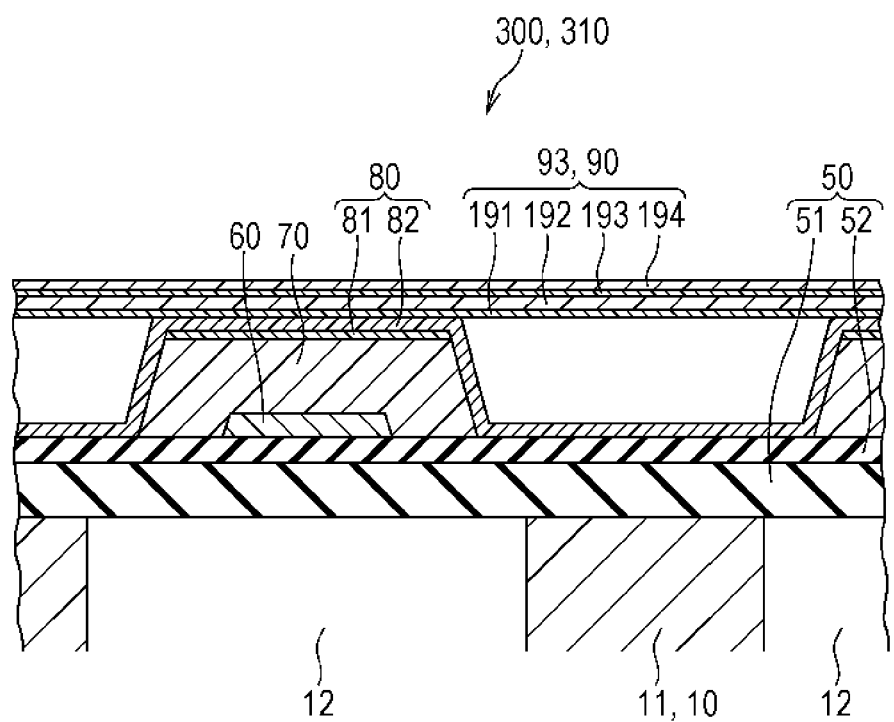
FIG. 5 is an enlarged cross-sectional view of some essential components of the recording head according to Embodiment 1 of the invention.

FIG. 1 is a perspective view of an ink jet recording head as an example of a liquid ejecting head according to Embodiment 1 of the invention. FIG. 2 is a plan view of the flow channel substrate used in the ink jet recording head. FIGS. 3A and 3B are cross-sectional views taken along lines IIIA-IIIA in FIG. 2. FIG. 4 is a cross-sectional view taken along line IV-IV in FIG. 2. FIG. 5 is a cross-sectional view taken along line V-V in FIG. 3A.

As illustrated in these drawings, the ink jet recording head I, an example of a liquid ejecting head according to this embodiment, has a flow channel substrate 10 that has pressure chambers 12. Defined by several walls 11, the pressure chambers 12 are arranged in the direction of the arrangement of several nozzle openings 21 configured to eject ink of the same color. This direction is hereinafter referred to as the direction of arrangement of the pressure chambers 12 or first direction X. The direction perpendicular to first direction X is hereinafter referred to as second direction Y.

The flow channel substrate 10 also has ink supply paths 13 and communicating paths 14 both defined by the walls 11. These components are located next to either longitudinal end of the pressure chambers 12, or in other words next to either end in second direction Y, the direction perpendicular to first direction X. The substrate also has a communicating space 15 as a component of a manifold 100, which serves as a common ink tank (liquid tank) for the pressure chambers 12, in the outside of the communicating paths 14 (opposite the pressure chambers 12 in second direction Y). The flow channel substrate 10 therefore has a flow channel formed by the pressure chambers 12, the ink supply paths 13, the communicating paths 14, and the communicating space 15.

A nozzle plate 20 drilled with nozzle openings 21 that communicate with the pressure chambers 12 is bonded with an adhesive agent, hot-melt film, or a similar material to either side of the flow channel substrate 10, or more specifically to the side on which the flow channel formed by the pressure chambers 12 and other components has openings. This means that the nozzle plate 20 has nozzle openings 21 arranged in first direction X.

A diaphragm 50 is disposed on the other side of the flow channel substrate 10. The diaphragm 50 in this embodiment is composed of an elastic film 51 on the flow channel substrate 10 and an insulating film 52 on the elastic film 51. The pressure chambers 12 and the other flow channel components are created by anisotropically etching the flow channel substrate 10 from either side, and the diaphragm 50 (elastic film 51) is on the other side of the pressure chambers 12 and the other flow channel components.

Piezoelectric elements 300 are disposed on the insulating film 52 and each have a first electrode 60, a piezoelectric layer 70, and a second electrode 80. The thickness of these layers is, for example, about 0.2 µm, about 1.0 µm, and about 0.05 µm, respectively. These piezoelectric elements 300 deformably provided to the substrate (flow channel substrate 10) serve as piezoelectric actuators in this embodiment.

The following describes the piezoelectric elements 300 as piezoelectric actuators in more detail with reference to FIGS. 3A and 3B and FIG. 4.

As illustrated in these drawings, the first electrode 60, a component of the piezoelectric elements 300, is composed of several pieces that correspond to the individual pressure chambers 12 and provide separate electrodes for active sections (described hereinafter). Each piece of the first electrode 60 (hereinafter simply referred to as the first electrode 60) is narrower than the pressure chamber 12 in the first direction X of the pressure chamber 12. In other words, the ends of the first electrode 60 in the first direction X of the pressure chamber 12 are within the area facing the pressure chamber 12. On the other hand, the ends of the first electrode 60 in second direction Y are both beyond the edge of the pressure chamber 12. The entire first electrode 60 should be made of a material that is not oxidized and maintains conductivity while the piezoelectric layer 70 (described hereinafter) is formed. Examples of suitable materials include noble metals such as platinum (Pt) and iridium (Ir), and conductive oxides such as lanthanum nickel oxide (LNO).

The first electrode 60 may have an adhesion layer that provides sufficient adhesion between the conductive material and the diaphragm 50. Although not illustrated, this embodiment uses an adhesion layer made of titanium. Other examples of materials that can be used to make such an adhesion layer include zirconium, titanium, and titanium oxide. The first electrode 60 in this embodiment therefore has an adhesion layer made of titanium and a conductive layer made of at least one selected from conductive materials including those listed above.

The piezoelectric layer 70 is continuous in first direction X and has a predetermined width in second direction Y. The width of the piezoelectric layer 70 in second direction Y is larger than the length of the pressure chamber 12 in second direction Y. This means that the piezoelectric layer 70 extends beyond the edge of the pressure chamber 12 in the second direction Y of the pressure chamber 12.

The end of the piezoelectric layer 70 on the ink supply path side in the second direction Y of the pressure chamber 12 is beyond the edge of the first electrode 60; the piezoelectric layer 70 covers the first electrode 60 at this end. The end of the piezoelectric layer 70 on the nozzle opening 21 side is within the edge of the first electrode 60 (i.e., closer to the pressure chamber 12); the piezoelectric layer 70 does not cover the first electrode 60 at the end on the nozzle opening 21 side.

The piezoelectric layer 70 is a perovskite-structured crystal film (perovskite crystals) made of a ferroelectric ceramic material and serves as an electromechanical transducer on the first electrode 60. Examples of materials that can be used to make the piezoelectric layer 70 include ferroelectric piezoelectric materials such as lead zirconate titanate (PZT) and derivatives containing metal oxides such as niobium oxide, nickel oxide, and magnesium oxide. Specific examples include lead titanate ($PbTiO_3$), lead zirconate titanate ($Pb(Zr, Ti)O_3$), lead zirconate ($PbZrO_3$), lead lanthanum zirconate ($(Pb, La)TiO_3$), lead lanthanum zirconate titanate ($(Pb, La)(Zr, Ti)O_3$), and lead zirconium titanate magnesium niobate ($Pb(Zr, Ti)(Mg, Nb)O_3$). The piezoelectric layer 70 in this embodiment is made of lead zirconate titanate (PZT).

In addition to piezoelectric materials containing lead (lead-based piezoelectrics), piezoelectric materials that contain no lead (lead-free piezoelectrics) can also be used to make the piezoelectric layer 70. Examples of lead-free piezoelectrics include the following: bismuth ferrite ($BiFeO_3$, abbreviated to BFO), barium titanate ($BaTiO_3$, BT), sodium potassium niobate ($(K, Na)NbO_3$, KNN), potassium sodium lithium niobate ($(K, Na, Li)NbO_3$), potassium sodium lithium niobate tantalate ($(K, Na, Li)(Nb, Ta)O_3$), bismuth potassium titanate ($(Bi_{1/2}K_{1/2})TiO_3$, BKT), bismuth sodium titanate ($(Bi_{1/2}Na_{1/2})TiO_3$, BNT), and bismuth manganite ($BiMnO_3$, BM); perovskite composite oxides containing bismuth, potassium, titanium, and iron ($x[(Bi_xK_{1-x})TiO_3]$-$(1-x)[BiFeO_3]$, BKT-BF); and perovskite composite oxides containing bismuth, iron, barium, and titanium ($(1-x)[BiFeO_3]$-$x[BaTiO_3]$, BFO-BT) and derivatives further containing metals such as manganese, cobalt, and chromium ($(1-x)[Bi(Fe_{1-y}M_y)O_3]$-$x[BaTiO_3]$, M: Mn, Co, Cr, or a similar metal).

As is described in more detail below, various methods can be used to form the piezoelectric layer 70, including liquid-phase techniques such as the sol-gel process and MOD (metal-organic decomposition), and also PVD (physical vapor deposition) techniques (gas-phase processes) such as sputtering and laser abrasion.

Such a piezoelectric layer 70 also has depressions 71 that correspond to the walls 11. The width of each depression 71 in first direction X is substantially equal to or larger than the width of each wall 11 in first direction X. This ensures moderate rigidity of the diaphragm 50 in the portions facing the ends of the pressure chambers 12 in second direction Y (the "arms" of the diaphragm 50), thereby allowing the piezoelectric elements 300 to be smoothly displaced.

The second electrode 80 is on the surface of the piezoelectric layer 70 opposite the first electrode 60 and serves as a common electrode for several active sections 310. The second electrode 80 in this embodiment has a first layer 81 on the piezoelectric layer 70 side and a second layer 82 on the surface of the first layer 81 opposite the piezoelectric layer 70.

It is desirable that the first layer 81 be made of a material that forms a good interface with the piezoelectric layer 70 and has insulating and piezoelectric properties. Examples of suitable materials include noble metals such as iridium (Ir), platinum (Pt), palladium (Pd), and gold (Au), and conductive oxides such as lanthanum nickel oxide (LNO). The first layer 81 may have two or more layers made of different materials. This embodiment uses a multilayer electrode composed of iridium and titanium (iridium on the piezoelectric layer 70 side). Various methods can be used to form the first layer 81, including PVD (physical vapor deposition) techniques (gas-phase processes) such as sputtering and laser abrasion, and also liquid-phase techniques such as the sol-gel process, MOD (metal-organic decomposition), and plating. After the first layer 81 is formed, post-annealing can be performed to improve the characteristics of the piezoelectric layer 70. Such a first layer 81 extends only on the piezoelectric layer 70, or more specifically only on the surface of the piezoelectric layer 70 opposite the flow channel substrate 10.

The second layer 82, another component of the second electrode 80, can be made of conductive materials including metallic materials such as iridium (Ir), platinum (Pt), palladium (Pd), and gold (Au). The second layer 82 may be made of one of such metallic materials or a mixture of two or more. It is also possible that a layer of titanium or a similar material is interposed between the first layer 81 and the second layer 82. The second layer 82 in this embodiment is made of iridium (Ir).

In this embodiment such a second layer 82 is continuous over the first layer 81, the sides of the piezoelectric layer 70 (not covered by the first layer 81), and the first electrode 60. The second layer 82 on the first layer 81 is electrically isolated from the second layer 82 on the first electrode 60 by a cut-out portion 83; the second layer 82 on the first layer 81 and the second layer 82 on the first electrode 60 are formed from the same layer but are electrically discontinuous. The cut-out portion 83 extends through the entire thickness of the first layer 81 and the second layer 82 (i.e., in the direction in which the first layer 81 and the second layer 82 are stacked) to electrically break the second electrode 80 on the nozzle opening 21 side of the piezoelectric layer 70. Such a cut-out portion 83 is continuous in first direction X and extends to cut the second electrode 80 through the entire thickness.

Having such a first electrode 60, a piezoelectric layer 70, and a second electrode 80, each piezoelectric element 300 is displaced when voltage is applied across the first electrode 60 and the second electrode 80. In other words, applying voltage across these two electrodes induces piezoelectric strain on the piezoelectric layer 70 in the section where this layer is sandwiched between the first electrode 60 and the second electrode 80. The active section 310 is the section of the piezoelectric layer 70 in which this layer undergoes piezoelectric strain when voltage is applied across the two electrodes, whereas the inactive section is the section where the piezoelectric layer 70 does not. The active section 310, in which the piezoelectric layer 70 undergoes piezoelectric strain, is flexible in the portion facing the pressure chamber 12 and inflexible in the portion extending outside the edge of the pressure chamber 12.

In this embodiment, the first electrode 60, the piezoelectric layer 70, and the second electrode 80 all extend beyond the edge of the pressure chamber 12 in second direction Y. The active section 310 therefore also extends beyond the edge of the pressure chamber 12. The active section 310 is therefore flexible in the portion where the piezoelectric element 300 faces the pressure chamber 12, and is inflexible in the portion extending outside the edge of the pressure chamber 12.

In other words, the ends of the active section 310 in second direction Y are defined by the second electrode 80 (or more specifically by the cut-out portion 83) in this embodiment, as illustrated in FIGS. 3A and 3B.

On the other hand, the ends of the active section 310 in first direction X are defined by the first electrode 60, and the ends of the first electrode 60 in first direction X are within the area facing the pressure chamber 12. The active section 310 is therefore flexible at the ends in first direction X, and the stress that occurs at the boundary between the active section 310 and the inactive section in first direction X is released when the diaphragm 50 is deformed. Thus, it is unlikely that stress concentrates at the ends of the active section 310 in first direction X and causes burnouts, cracks, or other sorts of damage.

In such a piezoelectric element 300, in which the second electrode 80 covers the piezoelectric layer 70, no current leakage occurs between the first electrode 60 and the second electrode 80; damage to the piezoelectric layer 300 is limited. If the first electrode 60 and the second electrode 80 were exposed and close to each other, leakage current would flow on the surface of the piezoelectric layer 70 and break the piezoelectric layer 70. Providing a sufficient distance between the first electrode 60 and the second electrode 80 avoids any current leakage, even when the two electrodes are exposed.

The first electrode 60 and the second electrode 80 of such a piezoelectric element 300 are coupled to a separate lead electrode 91 and a common lead electrode 92 that form a wiring layer in this embodiment.

The separate lead electrode 91 and the common lead electrode 92 (hereinafter collectively referred to as the lead electrode 90) in this embodiment are made from the same layer but are electrically discontinuous. More specifically, the lead electrode 90 has a first layer 191, a second layer 192, a third layer 193, and a fourth layer 194 stacked in this order from the main electrode (the second layer 82 of the second electrode 80) side. The three layers other than the first layer 191 are formed by electroless plating.

The first layer 191 is formed by pretreatment, and the main component of the first layer 191 is palladium (Pd). The first layer 191 serves as a catalyst (an activator) for electroless plating. The term pretreatment, as used herein, refers to a preliminary process for electroless plating, and this process includes coating the substrate with palladium. Coating techniques for the pretreatment include dip coating and spray coating (spin coating). Dip coating is a process that includes immersing the substrate in the coating solution. In a typical dip-coating process, the substrate is immersed in a sensitizer solution (tin chloride in hydrochloric acid) and then in an activator solution (palladium chloride in hydrochloric acid) so that palladium as catalyst is provided (the sensitizer-activator process). Spray coating is a process in which the substrate is sprayed with the coating solution from a nozzle. Another technique is ink jet coating, in which an ink jet recording head is used to apply the coating solution to the substrate. The first layer 191 in this embodiment is formed by dip coating, which allows batch processing and improves the efficiency of the production process.

The second layer 192 is formed and the main component of the second layer 192 is nickel (Ni). The second layer 192 contains columnar crystals of nickel that form during the early period of electroless plating and also contains an amorphous phase that grows thereafter. Gas-phase processes such as sputtering would provide a nickel layer that is totally composed of columnar crystals unlike that formed by electroless plating.

The third layer 193 is formed by electroless plating on the surface of the second layer 192 opposite the first layer 191. The main component of the third layer is palladium (Pd).

The fourth layer 194 is formed by electroless plating on the surface of the third layer 193 opposite the second layer 192. The main component of the fourth layer 194 is gold (Au).

In this way, a stack of the first layer 191, the second layer 192, the third layer 193, and the fourth layer 194 formed by pretreatment and electroless plating is used as the lead electrode 90, i.e., the wiring layer, and the first layer 191 is formed selectively in the area where the lead electrode 90 is to be formed (described in more detail hereinafter). This eliminates the need for a wet-etching process for patterning the lead electrode 90. The risk of electrochemical corrosion that could occur between the lead electrode 90 and the main electrodes (e.g., the first electrode 60 and the second electrode 80) with the use of an etchant is reduced, and this makes the lead electrode 90 less likely to detach. The risk of damage to the piezoelectric layer 70 that could be caused by the use of an etchant is also reduced. If the lowermost layer of the lead electrode 90, i.e., the layer closest to the main electrodes (the first electrode 60 and the second electrode 80), were made of nickel-chromium (NiCr) or a similar material, the etchant for this lowermost layer would be cerium ammonium nitrate or any other acid. The acid or a similar etchant would cause electrochemical corrosion to occur between the lowermost layer and the main electrodes, and the resulting reverse-tapered lead electrode 90 would be likely to detach. Furthermore, the etchant would come into contact with the piezoelectric layer 70, damaging the piezoelectric layer 70 and affecting the piezoelectric properties. Such a problem, i.e., electrochemical corrosion between the lowermost layer of the lead electrode 90 and the main electrodes, is also encountered with materials for the lowermost layer other than nickel-chromium (NiCr), such as nickel (Ni) and chromium (Cr), because even for such materials the etchant is still an acid and because materials suitable for electrodes generally have only a weak tendency to ionize. Selective formation of the lead electrode 90 by electroless plating as in this embodiment requires no etching and helps to prevent the lead electrode 90 from detaching and the piezoelectric layer 70 from being damaged.

In summary, forming the lead electrode 90 by electroless plating as in this embodiment prevents detachment and other defects by reducing the risk of electrochemical corrosion occurring between the lead electrode 90 and the main electrodes and providing a stable end shape to the lead electrode 90.

The uppermost layer of the lead electrode 90 is the fourth layer 194, and this gold (Au)-containing layer provides strength so that wiring 121 (described in detail hereinafter) can be firmly attached to the lead electrode 90 and the attached wiring 121 should be unlikely to detach. Attaching the wiring 121 directly to the nickel-based second layer 192 could result in the wiring 121 detaching because of poor adhesion. The gold (Au)-containing fourth layer 194 as the uppermost layer of the lead electrode 90 in this embodiment improves the adhesion between the lead electrode 90 and the wiring 121. The wiring 121 can be attached to the fourth layer 194 not only by wire bonding, but also by many other techniques such as soldering.

The gold-containing fourth layer 194 therefore improves the adhesion between the wiring 121 and the lead electrode 90 when extending at least over the area where the wiring 121 is attached. This means that the palladium-containing third layer 193, which is interposed between the second layer 192 and the fourth layer 194, may extend only over the area where the fourth layer 194 is to be formed. Omitting the third layer 193, i.e., forming the fourth layer 194 directly on the second layer 192, would cause the interdiffusion of nickel and gold that leads to the fourth layer 194 disappearing. The third layer 193 allows the gold-containing fourth layer 194 to be formed on the surface of the lead electrode 90 by preventing nickel and gold from interdiffusing.

The separate lead electrode 91 extends from the top surface of the first electrode 60 located outside the edge of the piezoelectric layer 70 and reaches the diaphragm 50.

The common lead electrode 92 extends from the top surface of the second electrode 80 in second direction Y and reaches the diaphragm 50 at both ends of the flow channel substrate 10 in first direction X.

The common lead electrode 92 has elongated portions 93 that extend in second direction Y above the walls of the pressure chamber 12, i.e., across the boundaries between the flexible and inflexible portions. Each elongated portion 93 is continuous over several active sections 310 in first direction X and is continuous with the common lead electrode 92 at both ends in first direction X. The common lead electrode 92 and the elongated portions 93 are continuous all around the periphery of the active sections 310 when viewed from the protective substrate 30 side. Such elongated portions 93 help to limit the damage to the piezoelectric layer 70 caused by the stress concentrating at the boundaries between the flexible and inflexible portions and also ensures a sufficient amount of displacement of the active sections 310 because the top of the flexible portion is kept substantially clear of the common lead electrode 92.

Such piezoelectric elements 300 are on the flow channel substrate 10, and a protective substrate 30 for protecting the piezoelectric elements 300 is bonded to the flow channel substrate 10 with an adhesive agent 35 as illustrated in FIGS. 1 and 2. The protective substrate 30 has a piezoelectric element housing 31, which is a recess that defines the space to accommodate the piezoelectric elements 300. The protective substrate 30 also has a manifold portion 32 as a component of the manifold 100. The manifold portion 32 extends through the entire thickness of the protective substrate 30 and along the direction of the width of the pressure chambers 12 and, as mentioned above, communicates with the communicating space 15 of the flow channel substrate 10. The protective substrate 30 also has a through-hole 33 that extends through the entire thickness of the protective substrate 30. For each active section 310, the lead electrode 90 coupled to the first electrode 60 is exposed in the through-hole 33, and either end of wiring that leads to a driver is coupled to the lead electrode 90 in the through-hole 33 (not illustrated).

A compliance substrate 40 that has a sealing film 41 and a stationary plate 42 is bonded to the protective substrate 30. The sealing film 41 is made of a low-rigidity flexible material, and the manifold portion 32 is sealed with the sealing film 41 on either side. The stationary plate 42 is made of a hard material such as metal. The stationary plate 42 has an opening 43 through the entire thickness over the area facing the manifold 100. One side of the manifold 100 is therefore sealed with the flexible sealing film 41 only.

Such an ink jet recording head I according to this embodiment receives ink from an external ink source (not illustrated) via an ink inlet, fills the entire space from the manifold 100 to the nozzle openings 21 with the ink, and then, in response to recording signals transmitted from a driver, distributes voltage between the pieces of the first electrode 60 for the individual pressure chambers 12 and the second electrode 80. This makes the piezoelectric elements 300 and the diaphragm 50 undergo flexural deformation. As a result, the pressure chambers 12 are pressurized and eject ink droplets through the nozzle openings 21.

The following describes a method for manufacturing such an ink jet recording head according to this embodiment. FIGS. 6A and 6B, 7A to 7C, 8A to 8E, 9A to 9C, and 10A to 10C are cross-sectional diagrams illustrating this method for manufacturing an ink jet recording head.

Figure 6A:
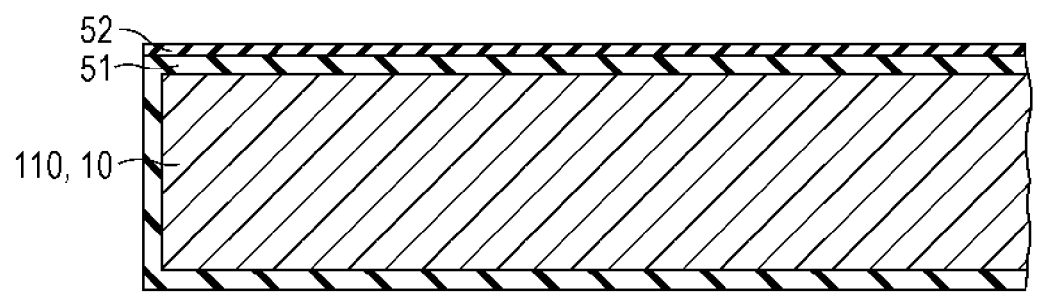
FIGS. 6A and 6B, 7A to 7C, 8A to 8E, 9A to 9C, and 10A to 10C are cross-sectional diagrams illustrating a method for manufacturing a recording head according to Embodiment 1 of the invention.

First, an elastic film 51 is formed on the surface of a flow channel substrate wafer 110 (a silicon wafer) as illustrated in FIG. 6A. In this embodiment, the flow channel substrate wafer 110 is thermally oxidized to form a silicon dioxide coating (the elastic film 51), and a layer of zirconium oxide is deposited by sputtering and then thermally oxidized (an insulating film 52) to complete a diaphragm 50.

The diaphragm 50 (for a multilayer diaphragm, the layer on the electrode side) should be made of an insulating material that withstands the temperature at which the piezoelectric layer 70 is formed (usually 500° C. or more). Creating the pressure chambers 12 and other flow channel components by anisotropically etching a silicon wafer as the base for flow channel substrates 10 with a KOH (potassium hydroxide) solution additionally requires that the diaphragm (for a multilayer diaphragm, the layer on the silicon wafer side) stop etching. When the diaphragm 50 contains silicon dioxide, furthermore, the constituents of the piezoelectric layer 70, such as lead and bismuth, can diffuse into and alter the silicon dioxide, making the upper electrodes and the piezoelectric layer 70 more likely to detach. In such a case, therefore, another layer is needed to protect the silicon dioxide from diffusive contaminants.

A stack of silicon dioxide and zirconium oxide is the most preferred structure of the diaphragm 50 because both materials withstand the temperature at which the piezoelectric layer 70 is formed and because silicon dioxide is an insulating material that stops etching whereas zirconium oxide is an insulating material that prevents diffusion. Although the diaphragm 50 in this embodiment is composed of the elastic film 51 and the insulating film 52, the elastic film 51 and the insulating film 52 can also be used alone as the diaphragm 50.

Figure 6B:
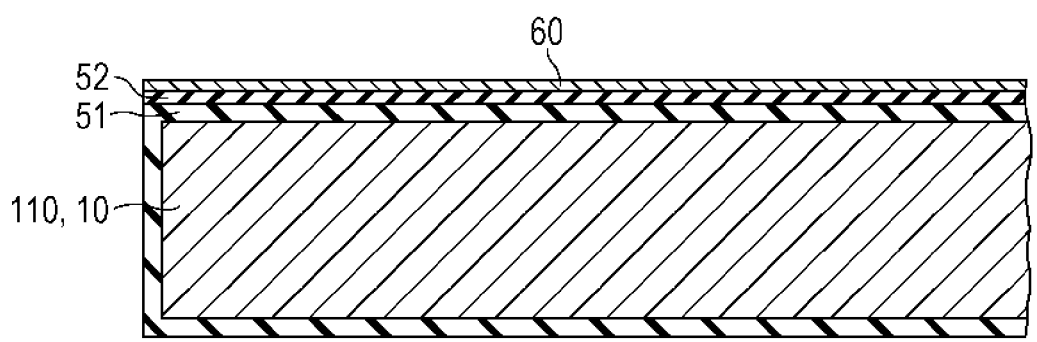

A first electrode 60 is then formed over the insulating film 52 as illustrated in FIG. 6B. The first electrode 60 can be made of any material that maintains conductivity when, for example, oxidized during heating for forming the piezoelectric layer 70 (usually at a temperature of 500° C. or more) or contaminated by any diffusive constituents of the piezoelectric layer 70. Examples of suitable materials for the first electrode 60 therefore include metals such as platinum and iridium and conductive oxides such as iridium oxide and lanthanum nickel oxide, including a stack of such materials, because such materials maintain conductivity even at high temperatures. Examples of methods that can be used to form the first electrode 60 include gas-phase film formation techniques such as sputtering, PVD (physical vapor deposition), and laser abrasion and liquid-phase techniques such as spin coating. An adhesion layer may be used to provide sufficient adhesion between the conductive material and the diaphragm 50. This embodiment uses an adhesion layer made of titanium (not illustrated). Other examples of materials that can be used to make such an adhesion layer include zirconium, titanium, and titanium oxide. Examples of methods that can be used to form such an adhesion layer are similar to those for the first electrode 60. An orientation control layer may be formed on the surface of the first electrode 60 (on the piezoelectric layer 70 side) to control the growth of the crystals that form the piezoelectric layer 70. In this embodiment, a layer of titanium is used to control the growth of the crystals that form the piezoelectric layer 70 (PZT). Titanium in such a layer is taken into the piezoelectric layer 70 while the piezoelectric layer 70 is formed, and leaves no residual film after the piezoelectric layer 70 is completed. Such an orientation control layer can also be made of perovskite-structured conductive oxides such as lanthanum nickel oxide. Examples of methods that can be used to form such an orientation control layer are similar to those for the first electrode 60. It is desirable that no residual insulating orientation control film exist between the piezoelectric layer 70 and the first electrode 60 after the piezoelectric layer 70 is completed. Such an insulating residue forms a series connection of capacitors with the piezoelectric layer 70 and weakens the electric field applied to the piezoelectric layer 70. This embodiment uses an orientation control layer made of titanium. This layer is taken into the piezoelectric layer 70, rather than being oxidized (turning into an insulating material), while being heated and leaves no residual film.

Then in this embodiment a lead zirconate titanate (PZT) piezoelectric layer 70 is formed. The piezoelectric layer 70 in this embodiment is obtained as a metal oxide film by the sol-gel process, in which a metal complex is dissolved or dispersed in a solvent to form sol, the sol is applied and the obtained coating is dried into gel, and the gel is fired at a high temperature to form the piezoelectric layer 70. Methods other than the sol-gel process can also be used to form the piezoelectric layer 70, including MOD (metal-organic decomposition), and also PVD (physical vapor deposition) techniques such as sputtering and laser abrasion. Both liquid-phase techniques and gas-phase techniques can therefore be used to form the piezoelectric layer 70. The piezoelectric layer 70 in this embodiment is prepared by stacking several piezoelectric films 74 as described below.

Figure 7A:
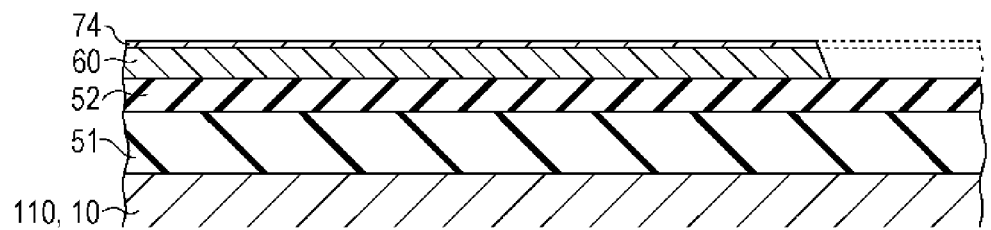

As illustrated in FIG. 7A, a first piezoelectric film 74 is formed on the first electrode 60, and the first electrode 60 and the first piezoelectric film 74 are simultaneously patterned to have sloping sides. Examples of methods that can be used to pattern the first electrode 60 and the first piezoelectric film 74 include dry etching processes such as reactive ion etching (RIE) and ion milling.

Patterning the first electrode 60 before forming the first piezoelectric film 74, for example, would affect the characteristics of the surface of the first electrode 60 and other components on this electrode such as a seed crystal layer made of titanium or a similar material (not illustrated) because the process of patterning the first electrode 60 would involve photographic operations, ion milling, and asking. Forming the piezoelectric film 74 on such an altered surface would result in insufficient crystallinity of the piezoelectric film 74. The poor crystallinity of the first piezoelectric film 74 would affect the crystals that grow to form the second and subsequent piezoelectric films 74. The resulting piezoelectric layer 70 would also be of insufficient crystallinity.

However, the approach of forming the first piezoelectric film 74 first and then patterning simultaneously with the first electrode 60 affects the crystals that grow to form the second and subsequent piezoelectric films 74 to a limited extent even if the patterning process forms a thin altered coating. This is because the first piezoelectric film 74 provides the seed for crystals to grow well into the second and subsequent piezoelectric films 74, compared to seed crystals made of titanium or a similar material.

When the second and subsequent piezoelectric films 74 are formed, an (intermediate) orientation control layer may be formed on the diaphragm 50 (the zirconium oxide insulating film 52 in this embodiment) before the second piezoelectric film 74. This embodiment uses an intermediate orientation control layer made of titanium. As with the titanium in the orientation control layer on the first electrode 60, this titanium-made intermediate orientation control layer is taken into the piezoelectric film 74 while the piezoelectric film 74 is formed. Any residue from such an intermediate orientation control layer can affect the piezoelectric properties by acting as an intermediate electrode or a dielectric material in a series connection of capacitors. It is therefore desirable that all of such an intermediate orientation control layer be taken into the piezoelectric film 74 (piezoelectric layer 70) and leave no residual film after the piezoelectric layer 70 is completed.

Figure 7B:
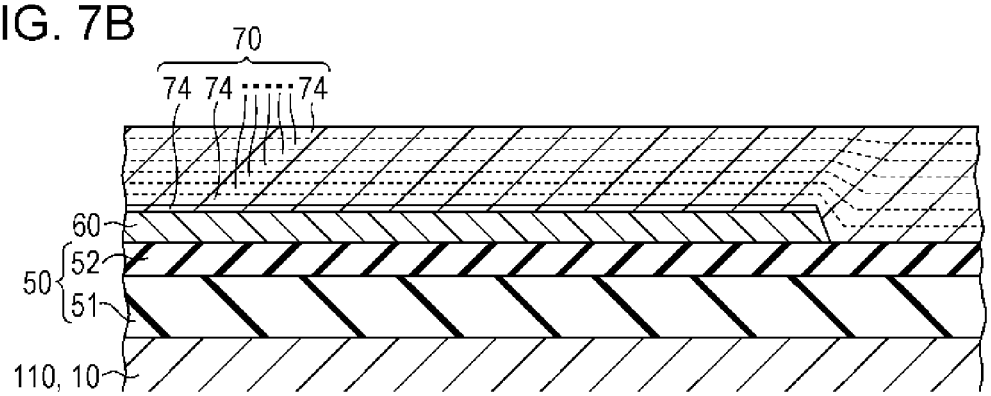

The second and subsequent piezoelectric films 74 are then stacked as illustrated in FIG. 7B. A piezoelectric layer 70 that has several piezoelectric films 74 is obtained in this way.

The second and subsequent piezoelectric films 74 is continuous over the insulating film 52, the sides of the first electrode 60 and the first piezoelectric film 74, and the top of the first piezoelectric film 74.

Figure 7C:
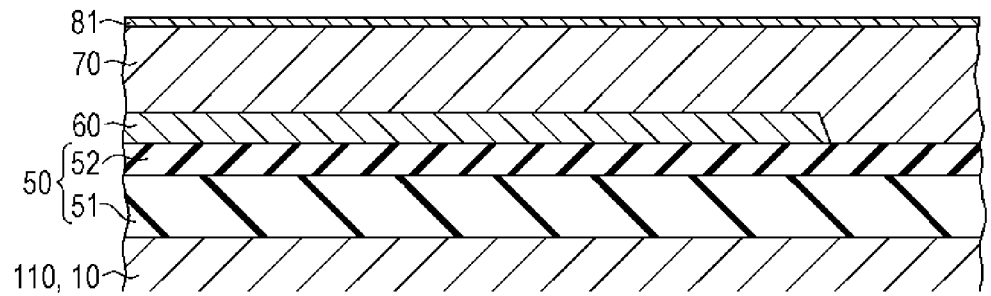

A first layer 81 of a second electrode 80 is then formed on the piezoelectric layer 70 as illustrated in FIG. 7C. In this embodiment, an iridium layer that contains iridium is first deposited on the piezoelectric layer 70, and then a titanium layer that contains titanium is deposited on the iridium layer (both not illustrated). The iridium layer and the titanium layer can be formed by sputtering or CVD, for example. The piezoelectric layer 70 is then heated once again, with the iridium layer and the titanium layer thereon (post-annealing). Although forming layers such as the iridium layer on the second electrode 80 side of the piezoelectric layer 70 can cause damage, such a post-annealing process repairs the damage to the piezoelectric layer 70 and improves the piezoelectric properties of the piezoelectric layer 70.

Figure 8A:
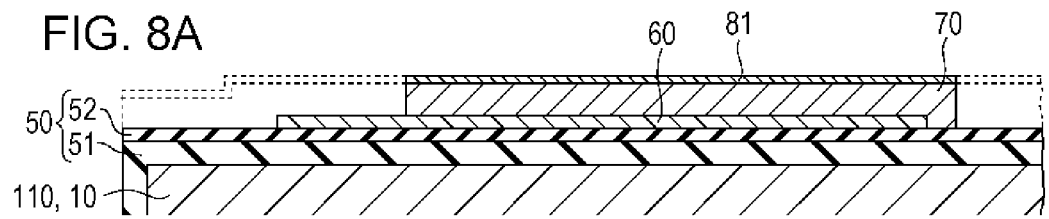

The first layer 81 and the piezoelectric layer 70 are then patterned after pressure chambers 12 as illustrated in FIG. 8A. In this embodiment these layers are patterned by photolithography, or more specifically by placing a patterned mask (not illustrated) on the first layer 81 and etching the first layer 81 and the piezoelectric layer 70 through the mask. Examples of methods that can be used to pattern the piezoelectric layer 70 include dry etching processes such as reactive ion etching and ion milling.

Figure 8B:
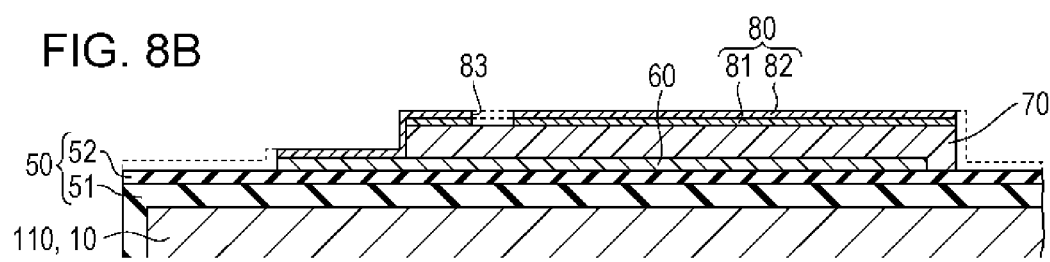

A layer of iridium (Ir) or a similar material is then deposited to form a second layer 82 on one side of the flow channel substrate wafer 110 (on the piezoelectric layer 70 side), or more specifically over several areas including the top of the first layer 81, the sides of the patterned piezoelectric layer 70, the top of the insulating film 52, and the top of the first electrode 60, as illustrated in FIG. 8B, to complete a second electrode 80. While the second layer 82 is patterned, some portion of the first layer 81 is also patterned to create a cut-out portion 83, defining active sections 310 of piezoelectric elements 300 and forming separate lead electrodes 91 and a common lead electrode 92.

Figure 8C:
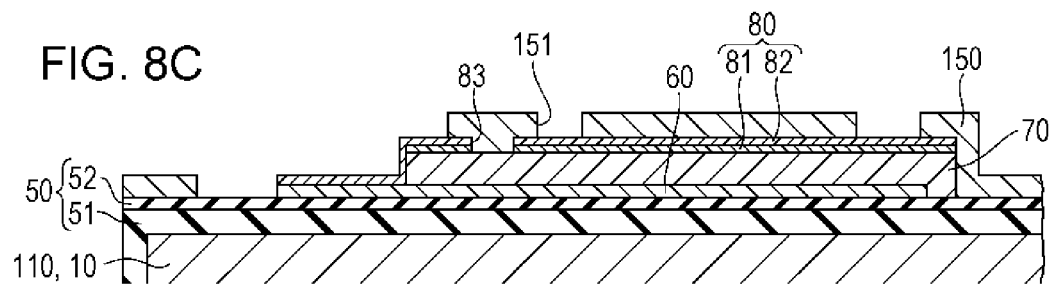

A mask 150 is then formed over one side of the flow channel substrate wafer 110 as illustrated in FIG. 8C. The mask 150 has an opening 150 in the region where a lead electrode 90 is to be formed.

Figure 8D:
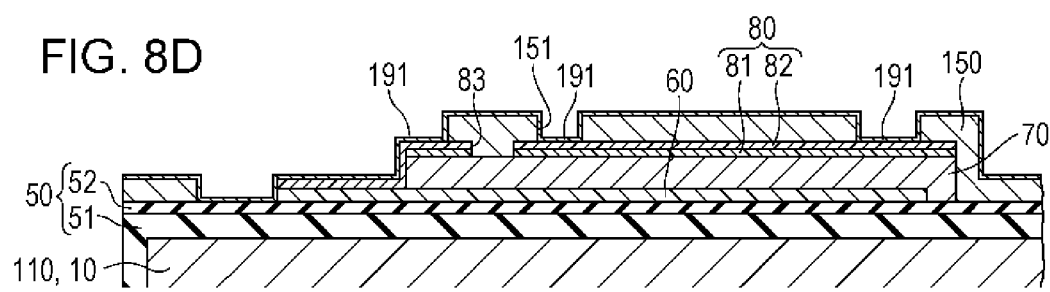

Then one side of the flow channel substrate wafer 110 is coated with a palladium (Pd)-containing first layer 192 by dip coating as illustrated in FIG. 8D. The first layer 191 is therefore continuous over the mask 150 including the inside of the opening 151 of the mask 150.

Figure 8E:
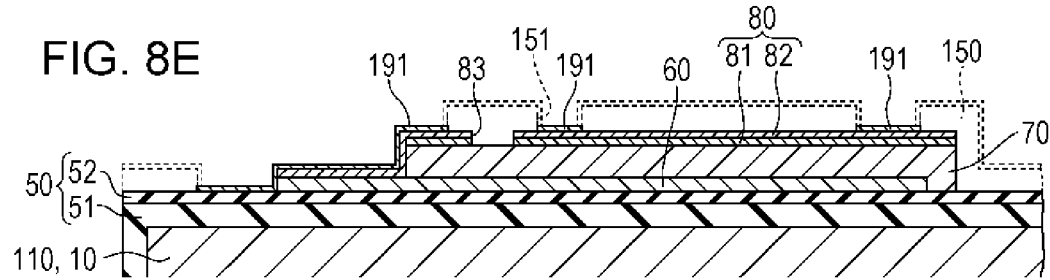

The mask 150 is then removed so that the first layer 191 is left only in the area defined by the opening 151 and the rest of the first layer 191 is removed together with the mask 150 as illustrated in FIG. 8E.

This selective way of forming the first layer 191 using the mask 150 helps to maintain the thickness of the first electrode 60 and the second electrode 80 compared to patterning the first layer 191 by dry etching or similar techniques because the damage to or the overetching of the piezoelectric layer 70 associated with the use of dry etching is prevented. The first layer 191 serves as a catalyst (an activator) for electroless plating.

Figure 9A:
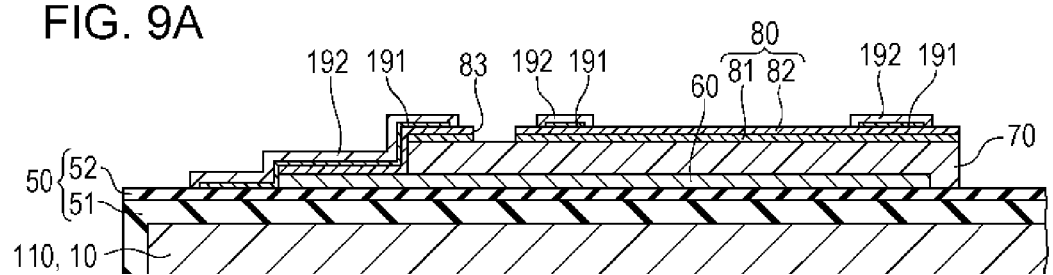

Then a nickel (Ni)-containing second layer 192 is formed on the first layer 191 by electroless plating as illustrated in FIG. 9A. Electroless plating allows the second layer 192 to be formed selectively on the first layer 191 by the catalysis of palladium (Pd) in the first layer 191.

Figure 9B:
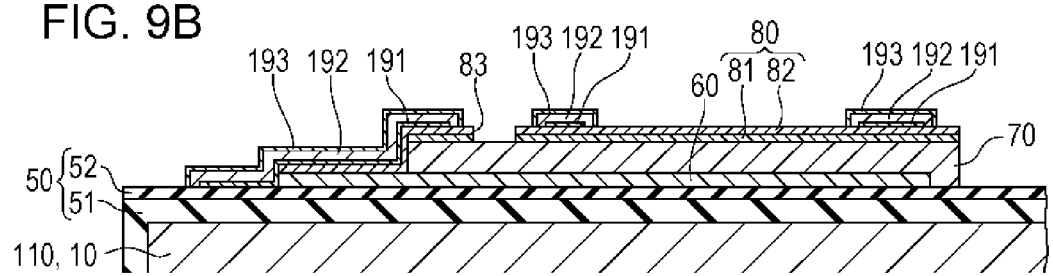

Then a palladium (Pd)-containing third layer 193 is formed on the second layer 192 by electroless plating as illustrated in FIG. 9B. Electroless plating allows the third layer 193 to be formed selectively on the second layer 192.

Figure 9C:
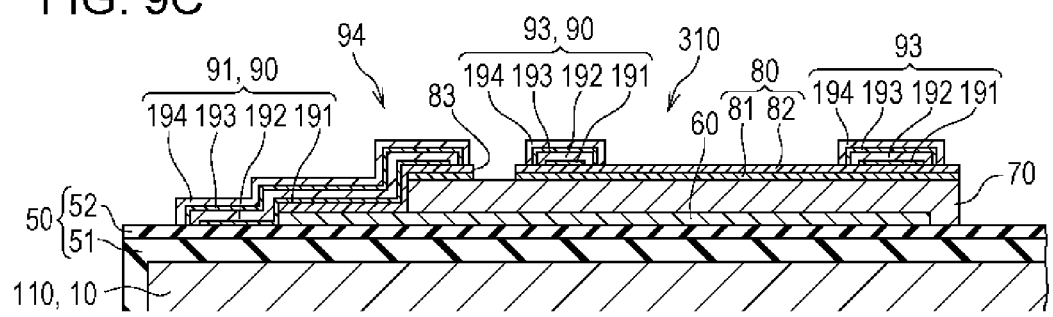

Then a gold (Au)-containing fourth layer 194 is formed on the third layer 193 by electroless plating as illustrated in FIG. 9C. Electroless plating allows the fourth layer 194 to be formed selectively on the third layer 193.

A lead electrode 90 (separate lead electrodes 91 and a common lead electrode 92) composed of the first layer 191, the second layer 192, the third layer 193, and the fourth layer 194 is obtained in this way.

This selective way of forming the lead electrode 90 by electroless plating, i.e., by a liquid-phase process rather than a gas-phase process, reduces the cost by limiting the formation of the second layer 192, the third layer 193, and the fourth layer 194 to the intended region. Patterning a nickel (Ni) or gold (Au) layer on one side of the flow channel substrate wafer 110 by etching would be costly because only little of the nickel or gold removed by etching could be collected. Forming the lead electrode 90 by electroless plating allows the lead electrode 90, in particular, the second layer 192 and the fourth layer 194, to be formed selectively in the intended region and does not involve etching that makes it difficult to collect nickel or gold; electroless plating allows more of the metal, e.g., nickel or gold, to be collected because nickel or gold can be collected from the plating solution. The use of electroless plating to form the lead electrode 90 therefore reduces the cost.

The selective formation of the lead electrode 90 by electroless plating also reduces the electrochemical corrosion that occurs between the lead electrode 90 and the main electrodes and makes the lead electrode 90 less likely to detach by eliminating the need to pattern the lead electrode 90 by wet etching or similar techniques. This approach also eliminates the risk that an etchant, which would be used in any wet-etching process, may reach the piezoelectric layer 70 and, therefore, reduces the damage to the piezoelectric layer 70 that could be caused by the use of an etchant, helping to maintain the intended piezoelectric properties of the piezoelectric layer 70.

Figure 10A:
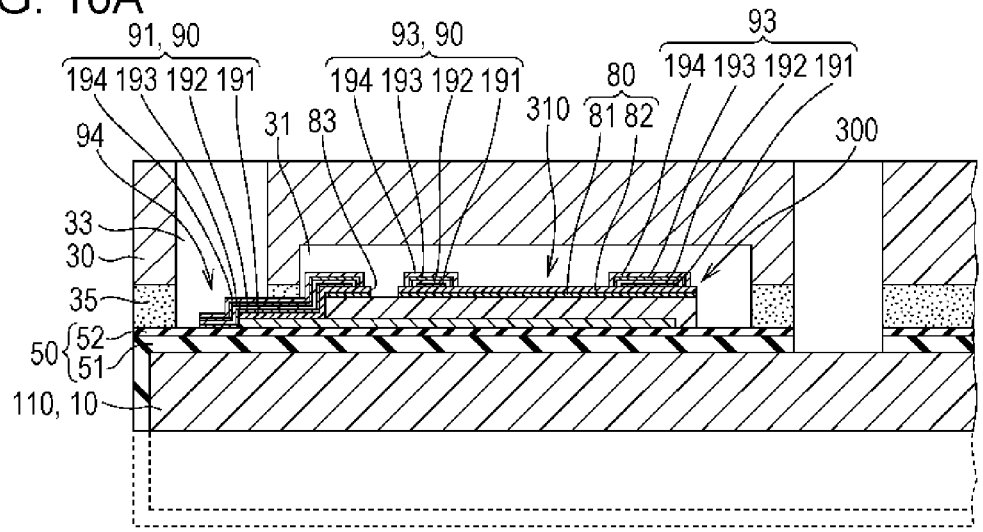

Then as illustrated in FIG. 10A, a protective substrate wafer 130 (a silicon wafer) as the base for several protective substrates 30 is bonded using an adhesive agent 35 to the piezoelectric element 300 side of the flow channel substrate wafer 110, and the flow channel substrate wafer 110 is thinned to a predetermined thickness.

Figure 10B:
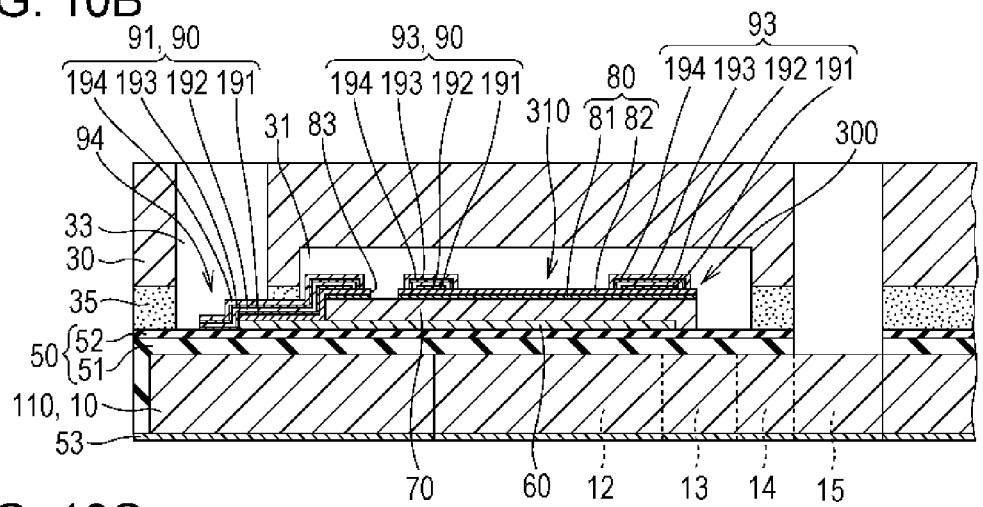
Figure 10C:
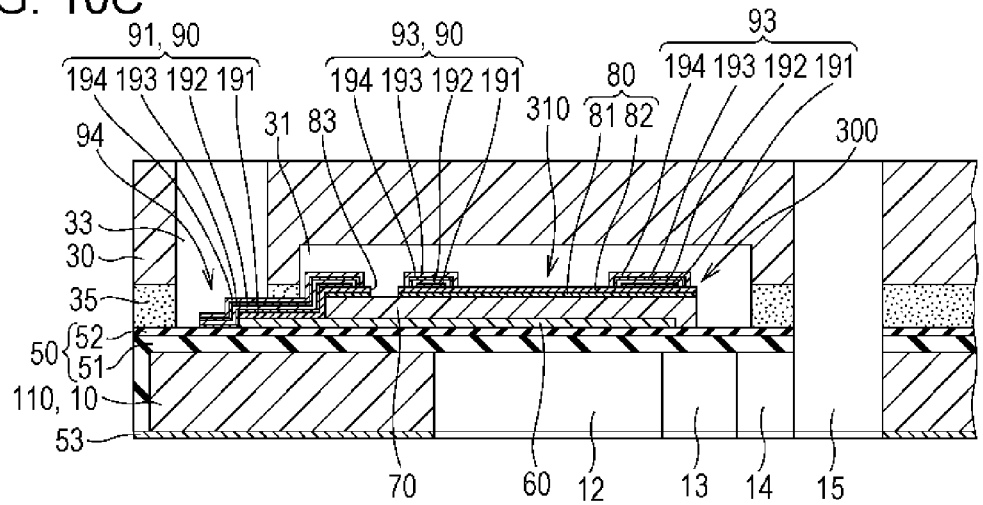

A mask coating 53 is then formed and patterned on the flow channel substrate wafer 110 as illustrated in FIG. 10B. The flow channel substrate wafer 110 is then anisotropically etched with a solution of an alkali such as KOH (wet etching) through the mask coating 53 as illustrated in FIG. 10C. This process creates the pressure chambers 12 for the individual piezoelectric elements 300 along with ink supply paths 13, communicating paths 14, a communicating space 15, and other features.

The flow channel substrate wafer 110 and the protective substrate wafer 130 are then trimmed by cutting off unnecessary edges by dicing or similar techniques. A nozzle plate 20 drilled with nozzle openings 21 is then bonded to the surface of the flow channel substrate wafer 110 opposite the protective substrate wafer 130, and compliance substrates 40 are bonded to the protective substrate wafer 130. The entire structure including the flow channel substrate wafer 110 and all other components is divided into equal-sized chips each composed of one flow channel substrate 10 and other components like the article illustrated in FIG. 1. In this way, ink jet recording heads according to this embodiment are obtained.

Embodiment 2

Figure 11A:
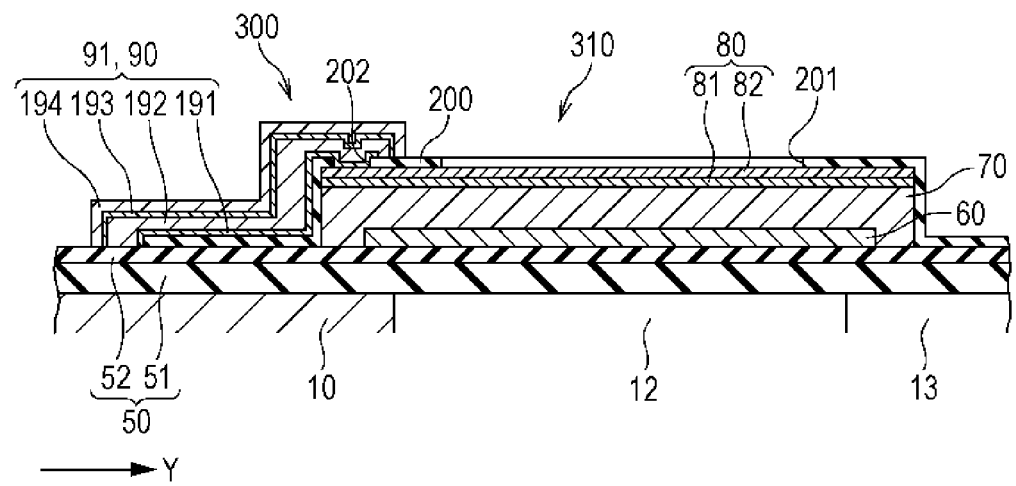
FIGS. 11A and 11B are enlarged cross-sectional views of some essential components of a recording head according to Embodiment 2 of the invention.
Figure 11B:
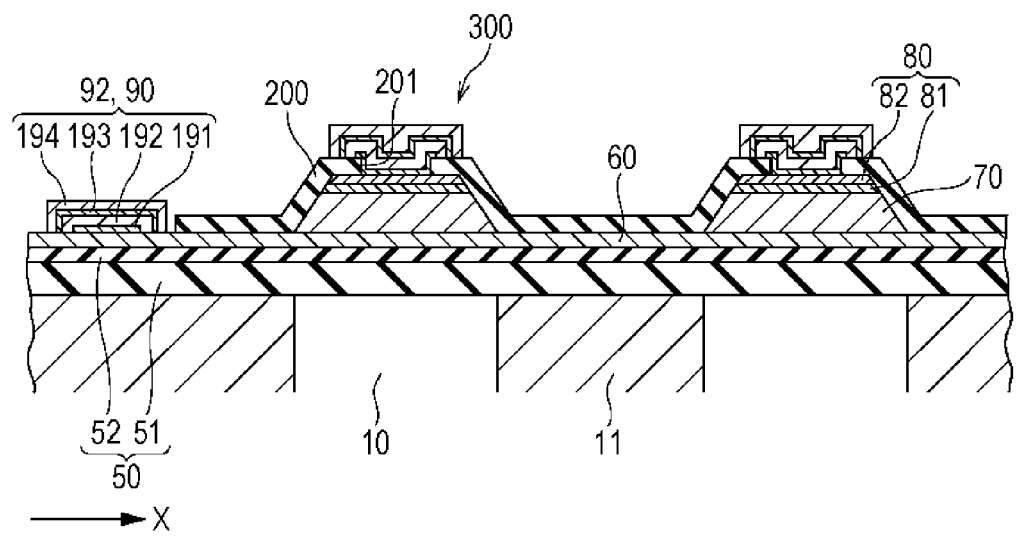

FIGS. 11A and 11B are enlarged cross-sectional views of some essential components of an ink jet recording head as an example of a liquid ejecting head according to Embodiment 2 of the invention. Those elements that have an equivalent in Embodiment 1 are given the same number in these drawings and are not described in detail in the following.

As illustrated in these drawings, an ink jet recording head I according to this embodiment has piezoelectric elements 300 in which the first electrode 60 is continuous over several active sections 310 and serves as a common electrode, whereas the second electrode 80 provides separate electrodes for the active sections 310.

More specifically, the first electrode 60 is narrower than the pressure chamber 12 in second direction Y and is continuous in first direction X.

The piezoelectric layer 70 extends beyond the edge of the first electrode 60, covering the ends of the first electrode 60 in second direction Y.

In first direction X, the piezoelectric layer 70 continuously extends from each active section 310 to the next and is thinner than the active sections 310 in such regions. This means that the first electrode 60 is completely covered with the piezoelectric layer 70 in the region between each active section 310 and the next in first direction X.

The second electrode 80 is composed of several pieces for the individual pressure chambers 12.

In such piezoelectric elements 300, the ends of the active section 310 in second direction Y are defined by the edge of the first electrode 60, and the ends of the active section 310 in first direction X are defined by the edge of each piece of the second electrode 80 (hereinafter simply referred to as the second electrode 80).

Each of such piezoelectric elements 300 has an insulating film 200. The insulating film 200 in this embodiment covers the sides of the piezoelectric layer 70, the sides of the second electrode 80, and the edge of the top of the second electrode 80 and is continuous over several active sections 310. The approximate middle portion, i.e., the main portion, of the top of the second electrode 80 is clear of the insulating film 200. Instead, an opening 201 makes the main portion of the top of the second electrode 80 exposed.

The opening 201 is a rectangular opening that cuts the insulating film 200 through the entire thickness (i.e., in the direction of stacking) and extends in the second direction Y of the piezoelectric element 300.

The insulating film 200 reduces the damage to the piezoelectric element 300 associated with environmental conditions such as moisture in the air by covering the piezoelectric element 300. The insulating film 200 also limits the leakage current that flows on the surface of the piezoelectric layer 70 between the first electrode 60 and the second electrode 80 by hiding the boundaries where the piezoelectric layer 70 is in contact with the first electrode 60 or the second electrode 80. Examples of materials that can be used to make such an insulating film 200 include inorganic insulators such as silicon oxide ($SiO_x$), tantalum oxides ($TaO_x$), and aluminum oxides ($AlO_x$) and organic insulators such as polyimides (PIs).

Furthermore, the opening 201 in the insulating film 200 helps to maintain good ink discharge properties by limiting the interference of the insulating film 200 with the piezoelectric elements 300 (active sections 310) during displacement.

Separate lead electrodes 91, i.e., a group of electrodes as a component of a lead electrode 90 that serves as the wiring layer, are on this insulating film 200. Each separate lead electrode 91 is coupled to the second electrode 80 via a contact hole 202 in the insulating film 200 at one end, and reaches the diaphragm 50 at the other end.

A common lead electrode 92 is on the first electrode 60. The common lead electrode 92 extends from the top surface of the first electrode 60 and reaches the diaphragm 50.

As in Embodiment 1, the lead electrode 90, composed of such separate lead electrodes 91 and a common lead electrode 92, has a first layer 191 formed by dip coating and a second layer 192, a third layer 193, and a fourth layer 194 formed by electroless plating.

With such a structure, the ink jet recording head I is advantageous like that in Embodiment 1. A stack of the first layer 191, the second layer 192, the third layer 193, and the fourth layer 194 formed by pretreatment and electroless plating is used as the lead electrode 90, i.e., the wiring layer, and the first layer 191 is formed selectively in the area where the lead electrode 90 is to be formed. This eliminates the need for a wet-etching process for patterning the lead electrode 90. The risk of electrochemical corrosion that could occur between the lead electrode 90 and the main electrodes (e.g., the first electrode 60 and the second electrode 80) with the use of an etchant is reduced, and this makes the lead electrode 90 less likely to detach. The risk of damage to the piezoelectric layer 70 that could be caused by the use of an etchant is also reduced.

Furthermore, forming the lead electrode 90 in a selective way using electroless plating, i.e., by a liquid-phase process rather than a gas-phase process, reduces the cost by limiting the formation of the second layer 192, the third layer 193, and the fourth layer 194 to the intended region.

This embodiment, in which the first electrode 60 serves as a common electrode for several active sections 310, allows, for example, the elastic film 51 and the insulating film 52 to be omitted and the first electrode 60 itself to work as a diaphragm. It is also possible that each piezoelectric element 300 substantially serves as a diaphragm, regardless of whether the first electrode 60 provides separate electrodes as in Embodiment 1 or the first electrode 60 serves as a common electrode. In any structure where the first electrode 60 is directly on the flow channel substrate 10, however, the first electrode 60 is preferably protected with an insulating protective film or a similar material so that electricity should be prevented from flowing from the first electrode 60 to the ink. When it is herein stated that the first electrode 60 is on the substrate (flow channel substrate 10), therefore, it means that the electrode can be in direct contact with the substrate or with any other component therebeneath (i.e., the electrode can be above the substrate).

Other Embodiments

The foregoing describes some embodiments of an aspect of the invention, and each embodiment is not the only possible basic structure of that aspect of the invention.

For example, although in the above embodiments the lead electrode 90 is a stack of a first layer 191, a second layer 192, a third layer 193, and a fourth layer 194, this is not the only possible structure of this electrode; for example, it is possible to use a stack of the first layer 191 and the second layer 192 as the lead electrode 90 to reduce the cost. However, the use of a lead electrode 90 that has a first layer 191, a second layer 192, a third layer 193, and a fourth layer 194 as in the above embodiments allows the user to improve the packing density by reducing the pitch of the lead electrode 90. Typical photolithographic processes would require that the pitch of the lead electrode 90 be determined with an allowance for the width corresponding to the amount of the electrode laterally etched. The electroless plating process in the above embodiments is less likely to cause the lead electrode 90 to be laterally etched. Such a process therefore allows the user to increase the packing density by reducing the pitch (the required pitch only) of the lead electrode 90.

To take another example, the piezoelectric layer 70 may be composed of several pieces for the individual active sections 310, although in Embodiment 1 the piezoelectric layer 70 is continuous over several active sections 310.

Likewise, although in Embodiment 1 the second electrode 80 is a stack of a first layer 81 and a second layer 82, this is not the only possible structure of this electrode; the second electrode 80 may be a single layer or a stack of three or more layers. The second electrode 80 in Embodiment 2 may also have two or more layers.

Another example is that the method used to form the piezoelectric films 74 in Embodiments 1 and 2, which includes applying and drying a precursor piezoelectric coating, degreasing the dried coating, and then firing the degreased coating, is not the only possible method for forming these films; for example, the piezoelectric films 74 can also be formed by more than one cycle (e.g., two cycles) of applying and drying a precursor piezoelectric coating and then degreasing the dried coating and subsequent firing that follows the completion of all these cycles.

Figure 12:
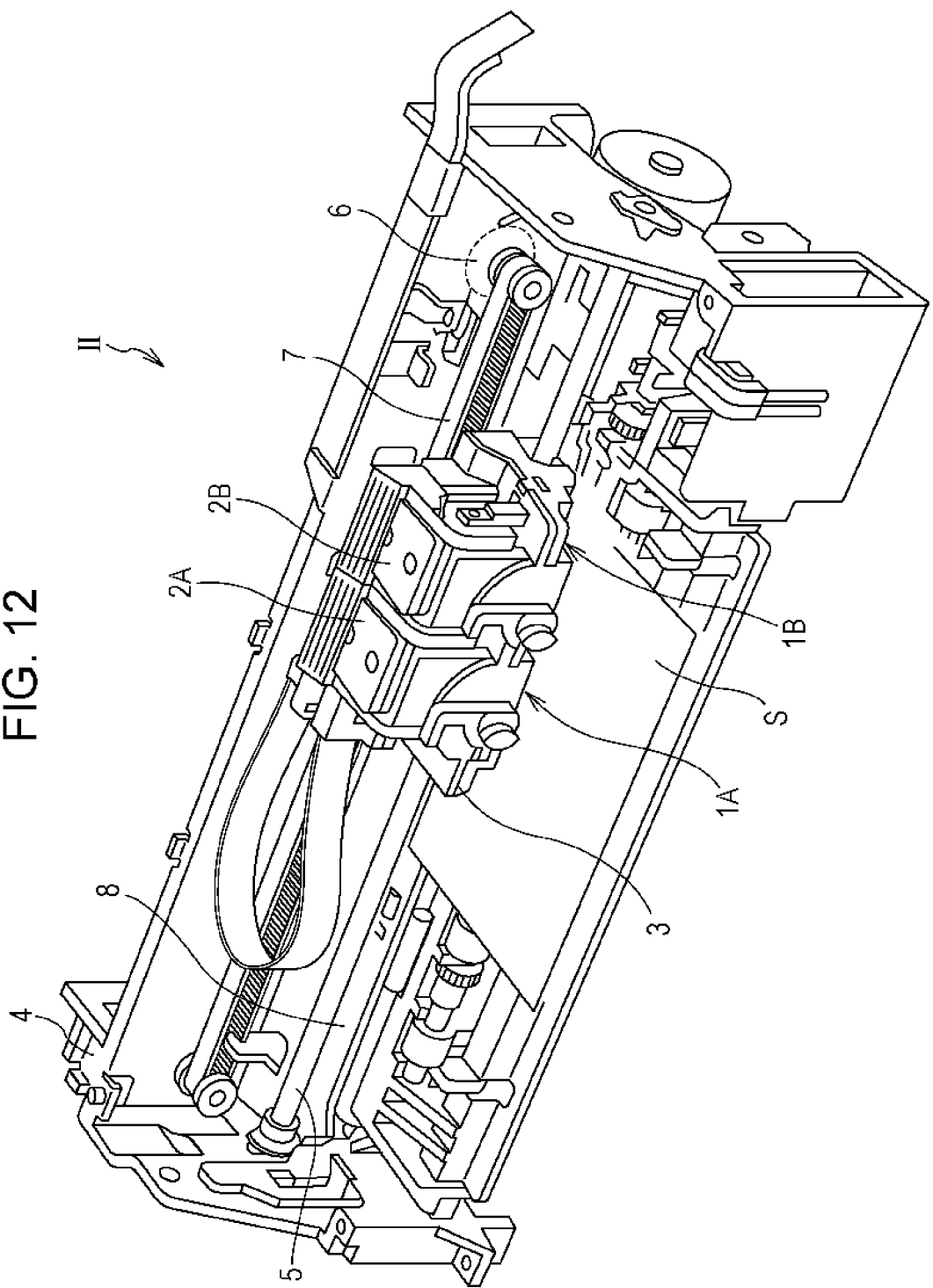
FIG. 12 is a schematic view of a liquid ejecting apparatus according to an embodiment of the invention.

As illustrated in FIG. 12, the ink jet recording head I can be installed in an ink jet recording apparatus II, for example. The recording head units 1A and 1B hold ink jet recording heads I and are equipped with detachable ink supply cartridges 2A and 2B. The carriage 3 for the recording head units 1A and 1B moves along a carriage shaft 5 installed in the main body 4. The recording head units 1A and 1B eject, for example, a black ink composition and a color ink composition, respectively.

Driving force generated by a motor 6 is transmitted through gears (not illustrated) and a timing belt 7 to the carriage 3. As a result, the carriage 3 and the recording head units 1A and 1B supported thereby move along the carriage shaft 5. The main body 4 also has a platen 8 that extends along the carriage shaft 5. A feeder such as a set of rollers (not illustrated) feeds a recording sheet S (a recording medium such as paper), which is then transported by the platen 8.

An aspect of the invention limits, as described above, damage to the piezoelectric elements 300 used in the ink jet recording heads I, thereby improving the durability of the ink jet recording apparatus II.

Although in the illustrated ink jet recording apparatus II the ink jet recording heads I move on the carriage 3 in the primary scanning direction, this is not the only possible configuration. For example, the ink jet recording apparatus II can be a line-head recording apparatus, in which the ink jet recording heads I remain in fixed positions and the recording sheet S (a recording medium such as paper) moves in the secondary scanning direction.

The ink jet recording heads described in the above embodiments are examples of liquid ejecting heads according to an aspect of the invention, and this aspect of the invention can also be applied to other liquid ejecting heads, such as recording heads for printers and other kinds of image recording apparatus, colorant ejecting heads for manufacturing color filters for liquid crystal displays and other kinds of displays, electrode material ejecting heads for forming electrodes for organic EL displays, FEDs (field emission displays), and other kinds of displays, and bioorganic substance ejecting heads for manufacturing biochips.

Furthermore, some aspects of the invention may be applied not only to piezoelectric elements for ink jet recording heads and other liquid ejecting heads, but also those for sonars and other ultrasonic devices, ultrasonic motors, and sensors such as pressure sensors and pyroelectric sensors. Some aspects of the invention may be applied to ferroelectric elements such as ferroelectric memories.

The entire disclosure of Japanese Patent Application No. 2013-043531, filed Mar. 5, 2013 is expressly incorporated by reference herein.

What is claimed is:

1. A liquid ejecting head comprising:
a flow channel substrate, the flow channel substrate including a pressure chamber communicating with a nozzle opening configured to eject liquid; and
a piezoelectric element, the piezoelectric element provided to the flow channel substrate and having a piezoelectric layer, a pair of electrodes, and a wiring layer coupled to at least one of the electrodes,
the wiring layer including:
a first layer containing palladium,
a second layer on the first layer, the second layer containing nickel,
a third layer on the second layer, the third layer containing palladium, and
a fourth layer on the third layer, the fourth layer containing gold.

2. The liquid ejecting head according to claim 1, wherein the pair of electrodes are a first electrode on a flow channel substrate side and a second electrode on a side of the piezoelectric layer opposite the flow channel substrate.

3. The liquid ejecting head according to claim 2, wherein:
the first electrode includes a plurality of separate electrodes for a plurality of active sections, i.e., practical actuating elements, the separate electrodes electrically isolated from each other; and
the second electrode serves as a common electrode for the active sections, the common electrode electrically continuous.

4. The liquid ejecting head according to claim 1, wherein the pretreatment for forming the first layer is dip coating.

5. A liquid ejecting apparatus comprising the liquid ejecting head according to claim 1.

6. A liquid ejecting apparatus comprising the liquid ejecting head according to claim 2.

7. A liquid ejecting apparatus comprising the liquid ejecting head according to claim 3.

8. A liquid ejecting apparatus comprising the liquid ejecting head according to claim 4.

9. A piezoelectric element comprising:
a piezoelectric layer;
a pair of electrodes; and
a wiring layer coupled to at least one of the electrodes,
the wiring layer including:
a first layer containing palladium,
a second layer on the first layer, the second layer containing nickel,
a third layer on the second layer, the third layer containing palladium, and
a fourth layer on the third layer, the fourth layer containing gold.

10. A method for manufacturing a piezoelectric element having a piezoelectric layer, a pair of electrodes, and a wiring layer coupled to the electrodes, the method comprising:
forming a mask on the electrodes with the electrodes exposed, the mask perforated at least in a region where the wiring layer is to be formed;
forming a palladium-containing first layer by pretreatment;
removing the mask; and
forming a nickel-containing second layer on the first layer by electroless plating.

11. The method for manufacturing a piezoelectric element according to claim 10, the method further comprising:
forming a palladium-containing third layer on the second layer by electroless plating; and
forming a gold-containing fourth layer on the third layer by electroless plating.

* * * * *